United States Patent [19]

Miersch et al.

[11] 4,295,183
[45] Oct. 13, 1981

[54] THIN FILM METAL PACKAGE FOR LSI CHIPS

[75] Inventors: Ekkehard F. Miersch, Boeblingen, Fed. Rep. of Germany; Lubomyr T. Romankiw, Briarcliff Manor, N.Y.

[73] Assignee: International Business Machines Corporation, Armonk, N.Y.

[21] Appl. No.: 53,497

[22] Filed: Jun. 29, 1979

[51] Int. Cl.³ .............................................. H05K 1/16
[52] U.S. Cl. ................... 361/403; 174/68.5; 361/392; 361/409
[58] Field of Search ............... 361/416, 392, 409, 403; 174/68.5

[56] References Cited

U.S. PATENT DOCUMENTS

| 3,217,089 | 11/1965 | Beck | 174/68.5 |
|---|---|---|---|
| 3,312,870 | 4/1967 | Rhoades | 361/413 X |
| 3,398,232 | 8/1968 | Hoffman | 361/409 X |
| 3,499,219 | 3/1970 | Griff | 174/68.5 X |
| 3,519,959 | 7/1970 | Bewley | 361/413 X |
| 3,530,411 | 9/1970 | Sear | 174/68.5 X |
| 3,663,866 | 5/1972 | Iosue | 361/416 X |
| 3,676,748 | 7/1972 | Kobayashi | 361/420 X |
| 3,832,769 | 9/1974 | Olyphant | 174/68.5 X |
| 3,875,478 | 4/1975 | Capstick | 361/403 |
| 4,237,522 | 12/1980 | Thompson | 361/392 |

OTHER PUBLICATIONS

Hedeman et al., Wiring Parallator, IBM Tech. Dis. Bull., vol. 13 #12, May 1971, pp. 3623 & 3624 relied on.

Primary Examiner—Richard R. Kucia
Attorney, Agent, or Firm—Graham S. Jones, II

[57] ABSTRACT

An integrated circuit board for mounting very high density chips of small size on its top surface including conductor planes for carrying very large values of ΔI (transient current) is constructed with a plurality of essentially flat parallel power planes serving as conductive leads to the chip connectors (pins or solder balls). The land areas on the top surface of the board are connected to conductors below by integrated coaxial conductor extensions from the planes having a high degree of capacitive coupling to adjacent conductor planes.

7 Claims, 10 Drawing Figures

THIN FILM METAL PACKAGE FOR LSI CHIPS

DESCRIPTION

1. Technical Field

This invention relates to packaging of LSI chips in high densities with improved electrical characteristics.

An object of this invention is to provide improved A.C. characteristics of packages for LSI chips in high density electronic systems.

Another object of this invention is to build decoupling capacitance into a packaging structure for LSI chips.

Still another object of this invention is inhibiting electrical noise generated in high speed computers by the simultaneous switching of large numbers of LSI circuits. This noise arises from the nonzero inductance, L, of the power supply network and is proportional to Ldi/dt where di is the total switched current with a risetime dt. The trend in future circuits is to reduce present risetimes as much as is practical.

A further object of this invention is to minimize inductance of the packaging structure and to provide increased capacitance to smooth out the associated voltage transients in a LSI system.

2. Background Art

U.S. Pat. No. 3,519,959 of Bewley et al describes a power distribution substrate with a number of parallel planar conductors for providing integral conductors and capacitors in a unit which is adapted to connect to a component board to which a number of electrical components are secured. The component board has an edge including a plurality of aligned pins which connect to a number of openings in the power distribution substrate where the planar conductors having apparently coaxial connections can contact the pins. However, the concept of securing integrated circuits directly to the planar conductors is not suggested.

Arnold et al "High Performance Power Distributor", 21, 1016-1018 (1978) teaches use of internal parallel power planes composed of printed circuits. It does not suggest elimination of decoupling capacitors by integrating capacitance into the structure or connection of integrated circuits to the power planes directly through vias, etc.

U.S. Pat. No. 3,189,847 of Rymaszewski commonly assigned provides an energy distribution system with decoupling characteristics which uses a number of parallel conductive patterns would helically ("spirally") about a dielectric from which contacts are provided along one edge.

U.S. Pat. No. 3,962,713 of Kendall et al shows formation of a capacitor upon a semiconductor wafer substrate by means of thin film techniques including etching the semiconductor and depositing the metal layers by techniques such as vacuum deposition upon a dielectric layer which was grown or deposited upon the semiconductor. A metal layer on the back of the wafer forms the other plate of the capacitor. Such a capacitor is shown upon the same wafer as a transistor and the capacitor is formed by a reverse biased PN junction.

BRIEF DESCRIPTION OF THE DRAWINGS

In accompanying drawings forming a material part of this disclosure.

DISCLOSURE OF INVENTION

Figure 1:
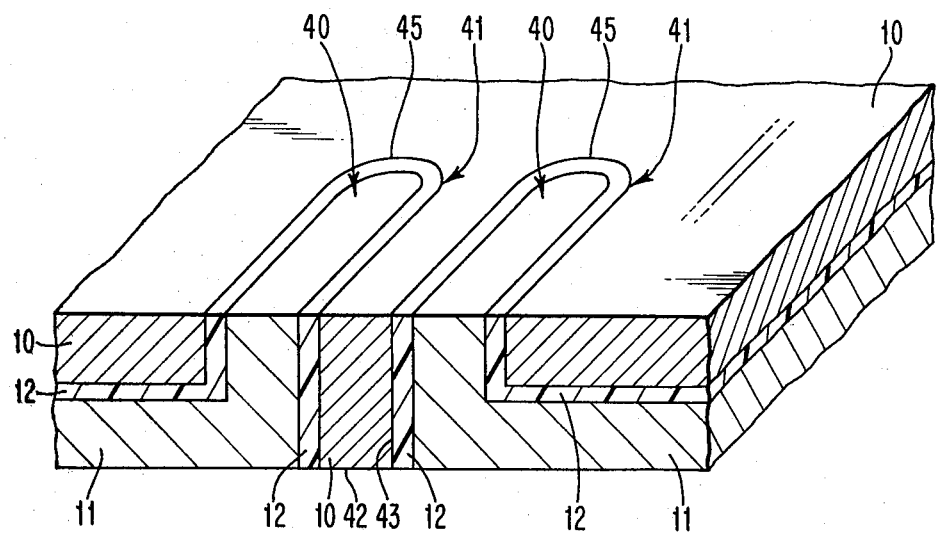
FIG. 1 is a sectional perspective view of a laminated packaging structure in accordance with this invention.
Figure 3:
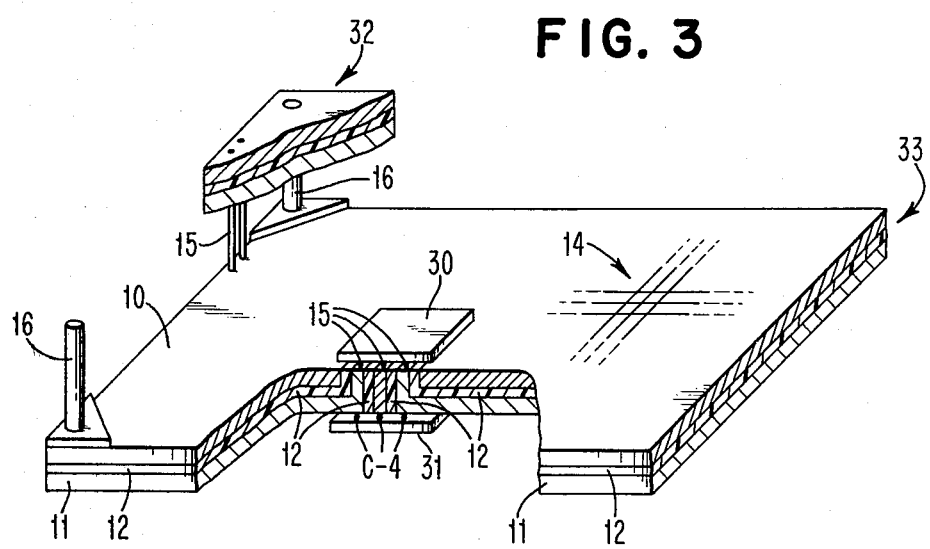
FIG. 3 is a sectional perspective view of a pair of laminated packaging structures in spaced superposition with a chip and a decoupling capacitor connected to the lower structure.
Figure 2:
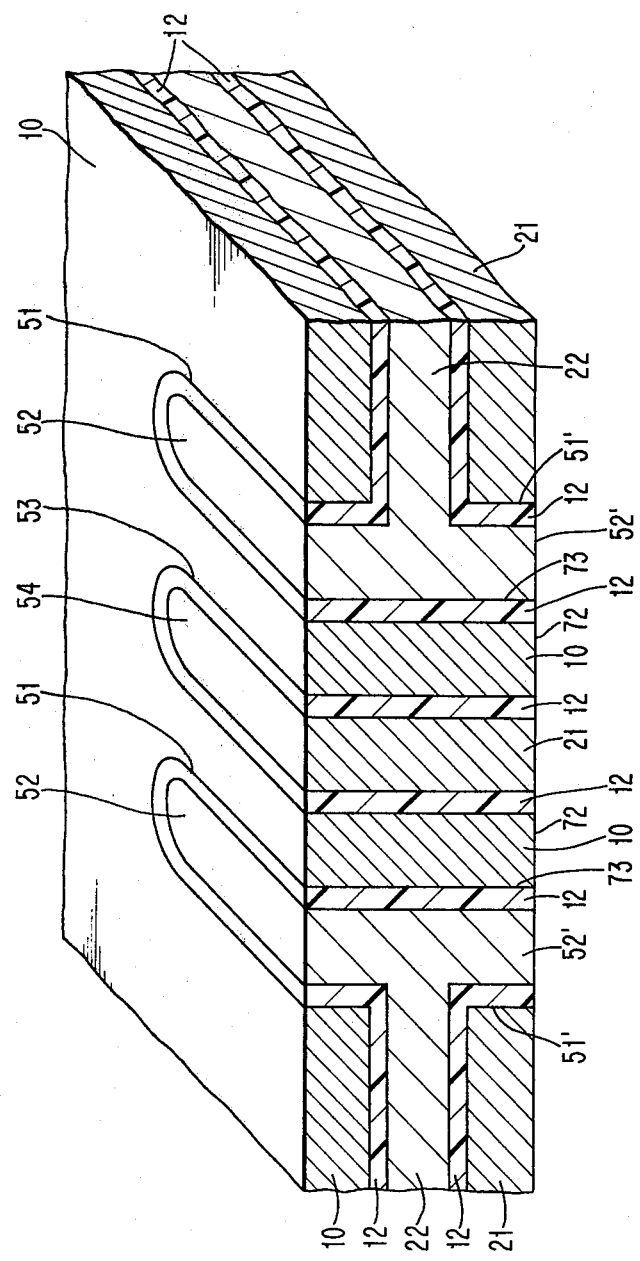
FIG. 2 is a similar view of FIG. 1 wherein an additional lamination layer added.

The packaging structure shown in FIGS. 1 and 2 consists of two or three generally parallel metal carrier sheets 10 and 11 (FIG. 1) or 10, 21 and 22 (FIG. 2) which sheets, together with insulating dielectric layers 12 between them combine to form a carrier sandwich. Carrier sheets 10 and 11 or 10, 21 and 22 serve as power supply planes for conducting and connecting electrical power to the C-4 terminals of LSI chips 30 in FIG. 3, for example. Chip 30 is an example of a large array of chips. In FIG. 3 on top of one side of the lower metal carrier sandwich 33 a multimetal layer thin film structure provides a grid 14 of orthogonal interconnection wires. Where necessary they are connected to the power planes of the carriers by vias which are not shown. Connection to other devices is made over C-4 solder pads 15 (See P. A. Totta, R. P. Sopher, "SLM Device Metallurgy and Its Monolithic Extension", IBM Journal of Research and Development, May 1969, pp 226-238). The carrier is designed to carry C-4 solder pad-mounted flip-chips 30. The connection between two different carriers 32 and 33 or to the next packaging level can be performed by pins 15 and/or edge connectors, press contacts or soldering. The power is supplied over power rods 16 (FIG. 3) cables or thicker pins. A chip 30 and a bonded decoupling capacitor 31 are shown. A fragment of the next metal carrier sandwich 32 is shown above the lower sandwich, supported on rod 16.

MATERIAL AND PROCESS REQUIREMENTS:

The metal carrier can be made of any highly conductive metal or alloy, which is desirable from the point of view of cost and fabrication. Metal formed by injection molding is most desirable. Suitable metals are aluminum or its alloys, beryllium or its alloys, copper or its alloys, and molybdenum or its alloys. Considering solder pad techniques and the expansion coefficient of $2.6 \times 10^{-6}/°C$. of silicon, molybdenum has a coefficient of $2.7 \times 10^{-6}/°C$. which is the closest expansion coefficient to silicon, and therefore is a preferred metal.

Dielectric 12 between the metal carrier sheets (10 and 11 in FIG. 1 for example) of the carrier sandwich separates the sheets (power planes) electrically, and connects them mechanically. Dielectric 12 must have good adhesion to the metal or its oxide. Dielectric 12 also must tolerate solder temperatures. Dielectrics, such as, polyimide, polysulfone, polycarbonate or any other high temperature polymers provide such characteristics. Inorganic materials such as some glasses and ceramics are satisfactory. Several refractory metals can be covered by native oxides which adhere well. In general, adhesion of polymers to oxides is good. In those cases, an excellent bond occurs automatically. With aluminum and beryllium, metal oxides are used to insulate thin film lines on top of the carrier for use in integrated circuit techniques. These oxides can be produced either by anodization or by other deposition methods.

In case of an aluminum carrier the process steps to achieve the carrier structure are as follows: Single metal sheets, manufactured by machining or injection molding are coated with oxide by anodization. The dimensional tolerances for the power supply sheets take into account anticipated growth or shrinkage of each individual metal sheet from anodization. This allows for interleaving of the metal carrier sheets. Note that pads 40 comprise generally rectangular shapes in openings 41 in the upper surface of plane 10, with rounded ends 45. Similarly pad 42 comprises a generally rectangular shape in opening 43 in the lower surface of sheet 11, with rounded ends (not shown).

The metal carrier sheets 10 and 11 are insulated from each other for direct current by polymer 12 as well as the anodized $Al_2O_3$. The relatively high dielectric constant of $Al_2O_3$ between the metal sheets is favorable, because it increases the AC-coupling between the power supply planes 10 and 11, which act at the same time as a decoupling capacitor. In further processing steps if necessary, the surface is planarized by lapping so the surface topography meets the flatness requirements of following thin film interconnection layers.

The structure can include Al metallurgy and $Al_2O_3$ as insulators as follows: After the carrier surface is planarized, an aluminum layer of about 50 $\mu$m is deposited on top of a 200 Å thick layer of Ta, Nb, Hf, etc., like Ti, Si. At this point studs are formed by selectively anodizing the Al in all areas except at contacts. The tantalum (Nb, Hf, Ti, etc.) under $Al_2O_3$ is converted to niobium (Ta, Hf, Ti, etc.) oxide in a subsequent oxidation step. From a point of view of contact resistance it may be desirable to omit Nb, (Ta, Hf, Ti, etc.) from the contacts areas. In such a case a masking step can be used to remove Nb (Ta, Hf, Ti, etc.) from the contact prior to Al deposition.

Subsequent interconnection layers are built up by depositing an additional pair of Nb (Ta, Hf, Ti, etc.) and aluminum layers. This is followed by appropriate masking steps and selective anodizing to define the wiring pattern of the first layer of interconnection wires. As in the previous step, the niobium has to be converted to Nb (Ta, Hf, Ti) oxide.

Both the stud (or via) layers and conductor metallurgy layers are formed in the same manner except that the stud layers use different masks from the conductor layers. Thus, the Nb (Ta, Hf, Ti, etc.) and Al deposition, masking, anodization and heating steps are repeated as many times as is necessary to build up the desired number of interconnection layers.

Alternatively the required number of interconnection wire layers can be achieved through the use of polyimide and copper, polyimide and gold, Parylene (a trademark of Union Carbide Corporation) polyparaxylene film and copper and Parylene film and gold. The combination of a molybdenum carrier with polyimide as an insulator, and copper thin film wires in Parylene film ($\epsilon = 3$) as an insulator is a most promising high speed carrier approach. Both copper and gold would be electroplated or deposited by electroless means.

In FIG. 2, the upper carrier sheet 10 rests above intermediate carrier sheet 22, which in turn rests upon lowercarrier sheet 21. Separating the carrier sheets in the same way as in FIG. 1 are the layers 12 of dielectric material. The intermediate sheet 22 serves as a power plane with pads 52 extending up through sheet 10 in openings 51 in sheet 10 and pads 52' extending down through lower sheet 21 in openings 51' through sheet 21. In addition, lower sheet 21 also serves as a power plane and it has a pad 54 extending up through hole 53 through sheets 22 and 10 to the upper surface of sheet 10. Similarly, holes 73 are provided through sheets 22 and 21 so that pads 72 can extend through to the lower surface of sheet 21 from upper sheet 10 to permit connections to the upper sheet from below the sandwich of sheets.

BEST MODE FOR CARRYING OUT THE INVENTION

Figure 4A:
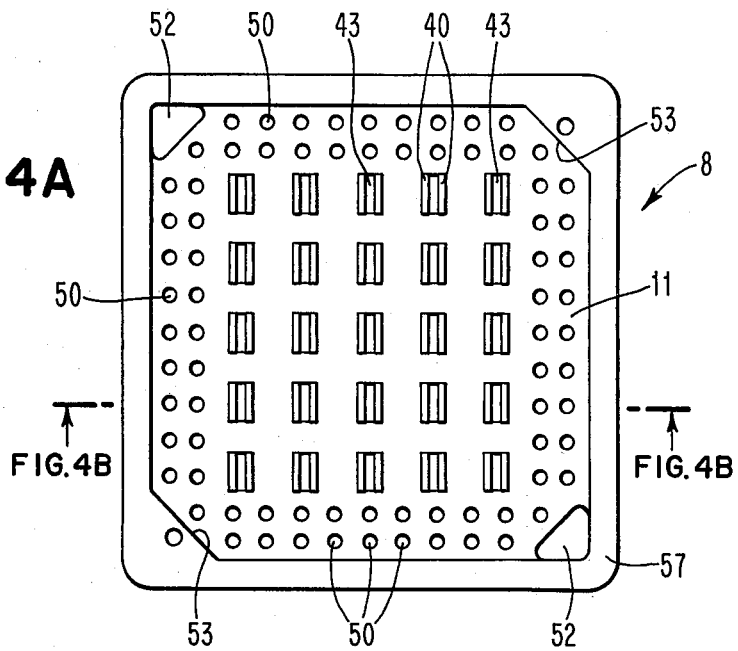
FIG. 4A shows a plan view of a lower conductive element of a liminated packaging structure in accordance with the instant invention.
Figure 4B:
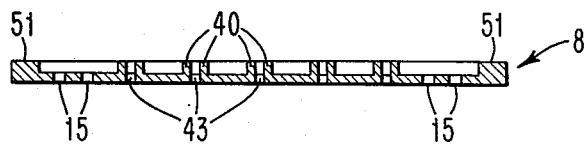
FIG. 4B is a sectional view taken along line 4B—4B in FIG. 4A.
Figure 4C:
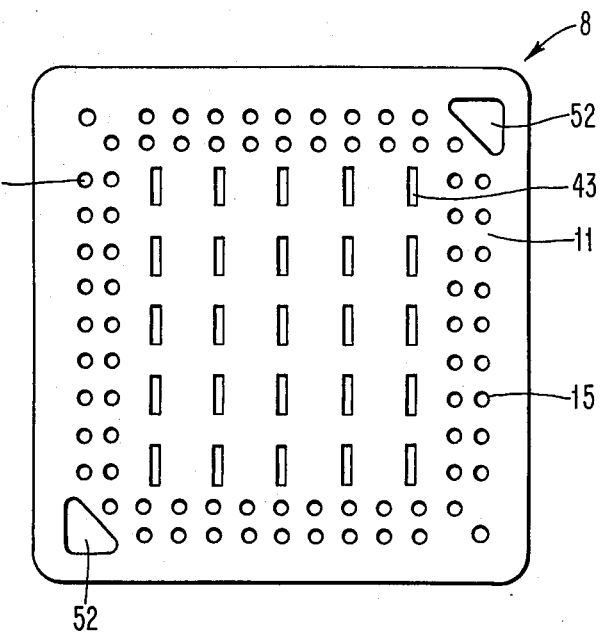
FIG. 4C is a bottom view of the conductive element shown in FIG. 4A.
Figure 5A:
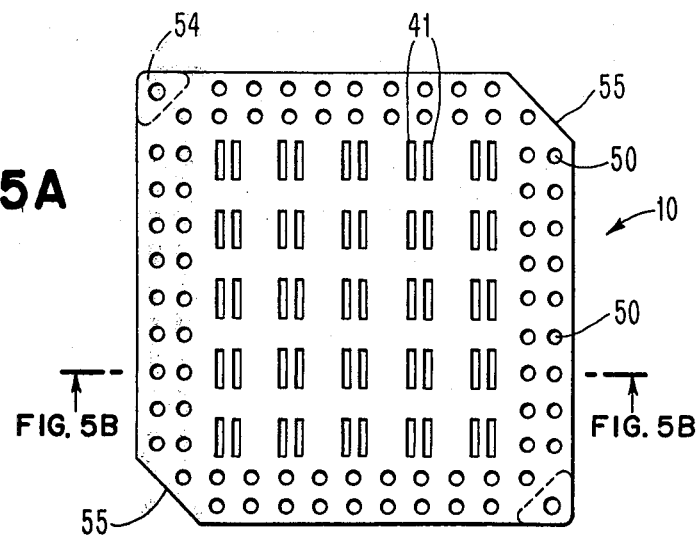
FIG. 5A is a plan view of a mating upper conductive element adapted for insertion into the element of FIGS. 4A-C.
Figure 5B:
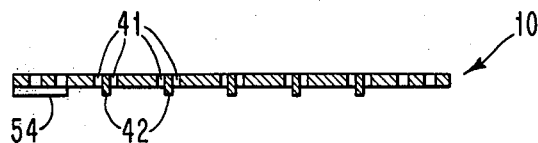
FIG. 5B is a sectional view taken along line 5B—5B in FIG. 5A—5A.
Figure 5C:
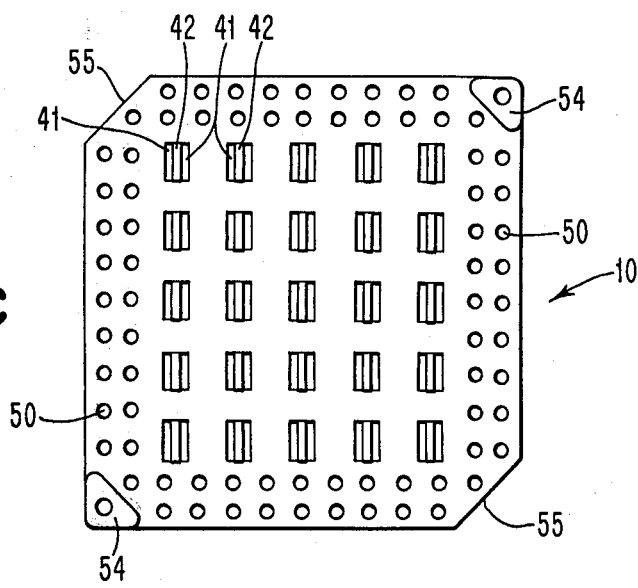
FIG. 5C is a bottom view of the conductive element of FIG. 5A.
Figure 6:
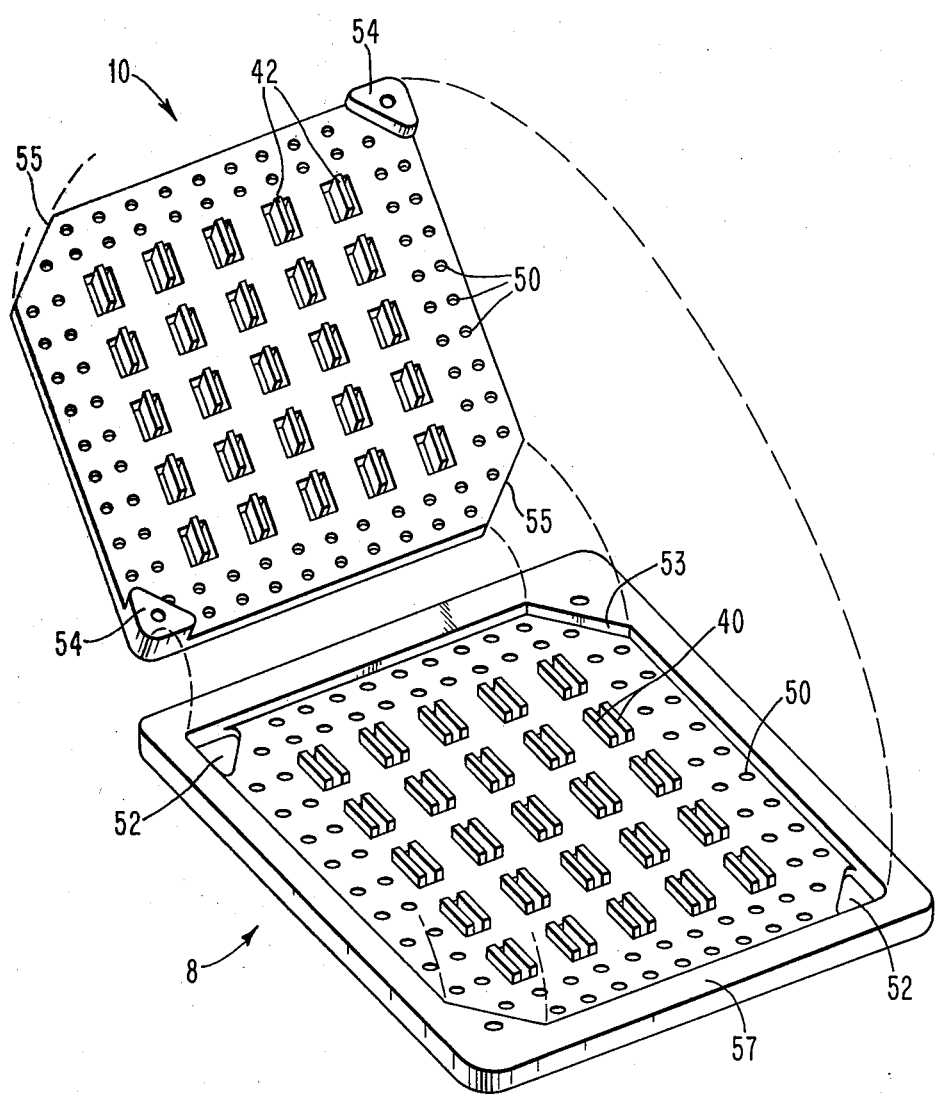

In FIG. 4A, the lower conductive element 8 includes the lower conductive sheet 11 of FIG. 1 with the pads 40 (preferably with rounded ends not shown in FIGS. 4A and 6B for convenience of machining during manufacture) and openings 43 for accepting pads 42 (preferably with rounded ends not shown in FIGS. 5C and 6). In addition, near the periphery of the element 8 is located an array of apertures 50 for vias. The vias would comprise wires having substantially smaller diameters than the apertures 50. An alignment flange 57 is also provided about the edge of the element 8 for holding the upper element 10 shown in FIG. 5 which comprises the upper sheet 10. Alignment holes 52 are provided in the corners of the sheet 11 which are diagonally opposite for reception of projections 54 on the upper sheet in FIG. 5B and 5C. Alignment edges 53 are provided on the other diagonally opposed edges of the inner margin of flange 57 for holding or aligning edges 55 of plane 10. When FIG. 5A is superposed upon FIG. 4A as shown in FIG. 6, the upper sheet 10 is inserted into the area surrounded by flange 57 and the clearances are selected to be sufficient that the application of dielectric 12 prior to assembly of parts 8 and 10 together will afford uniform dielectric thickness and insulation of the members from one another. Note that each of pads 42 is inserted between two pads 40 in element 8.

INDUSTRIAL APPLICABILITY

This invention is adapted to packaging of large scale integration chips carrying electronic solid state circuits with low resistance and high capacitive coupling between the power supply conductors providing electrical power to the chips.

A salient objective in packaging circuits for future high speed computers is inhibiting of electrical noise from simultaneous switching of a large number of circuits. This noise arises from the non-zero inductance, L, of the power supply network and is proportional to $L\Delta I/\Delta t$, where $\Delta I$ is the total switched current with a risetime $\Delta t$.

This noise is typically controlled in part by minimizing power supply inductance and in part by using decoupling capacitors which smooth out the associated voltage transients in the power supply networks. Future performance requirements suggest the need to provide "integrated capacitors" (minimum self and lead inductance) physically placed as closely as possible to the semiconductor chips.

While this specification illustrates and describes the preferred embodiments of the subject invention, it is to be understood that the invention is not limited to the precise implementation and construction details described herein. The right is reserved to all changes and modifications encompassed by the scope of the underlying invention as defined in the claims which follow.

Having thus described our invention, what we claim as new, and desire to secure by Letters Patent is:

1. In an electronic chip carrier, a substrate with pad areas thereon for connection to a thin film, integrated circuit chip, a said chip connected to said pad areas, said substrate including a plurality of conductors coupled to said pad areas for electrical connection of said pads to various points, the improvement comprising connecting means for said chip to said pad areas by means of connections on the base of said chip, said conductors comprising a plurality of parallel conductive planar metallic sheets having large parallel surfaces with a layer of high dielectric material between adjacent ones of said sheets for providing high electrical capacitance and minimal inductive coupling therebetween, and at least one of said pads extending through at least one of said planar metallic sheets, each said pad being electrically insulated from said sheets through which it passes.

2. A substrate in accordance with claim 1 wherein said conductors and said pad areas are coupled by means of coaxial structures with low inductance.

3. In a structure for packaging at least one integrated circuit chip, including a chip with active devices thereon, said chip having pad connection devices adapted to connect to pads, said structure including stacked parallel conductive elements generally shaped as flat sheets, said elements being adapted for carrying currents from a power supply to said chips, the improvement comprising at least one of said conductive elements having at least one projection comprising a pad extending through a hole in a said stacked element towards said chip and connected to a said pad connection device, said hole and said pad having complementary shapes conforming to each other, a thin layer of high dielectric constant insulating material providing uniform spacing between said stacked elements including said pad and said hole, whereby said pad and said element with said hole form a capacitor and have an electrically coaxial relationship.

4. The structure of claim 3 wherein on said element with said hole, adjacent to said pad, layers of interconnection wires are deposited upon said element for connection to signal lines of said chips.

5. The structure of claim 3 wherein said insulating material has a predetermined high dielectric constant and a predetermined spacing, whereby said elements possess substantial decoupling capacitance between each other.

6. In an electronic chip carrier, a substrate with pad areas thereon for mounting leads of thin film, integrated circuit chip, a chip connected to said pad areas and said substrate including a plurality of conductors coupled to said pad areas for electrical connection of said pads to various points, the improvement comprising forming said conductors from a plurality of parallel conductive planar metallic sheets having large parallel surfaces with high electrical capacitance between said sheets and minimal inductive coupling therebetween with said chip mounted above the primary one of said conductors, said primary conductor having openings therein, a plurality of pads extending out from a supporting one of said conductors into mating ones of said openings in said primary conductor, said pads extending coaxially through said openings, said pads being separated from contact with said primary conductor by means of a dielectric material with a high dielectric constant, and said chip being permanently bonded electrically and mechanically to said pad areas.

7. A chip carrier in accordance with claim 6 wherein said supporting conductor includes a plurality of apertures therethrough, a pair of said pads on opposing sides of each of said apertures, with said primary conductor including complementary pairs of said openings therein adapted to receive said pads in mating relationship in a quasi-coaxial relationship between said pads and said primary conductor including outwardly extending projections therefrom between pairs of said openings, each extending out in mating relationship into one of said apertures.

* * * * *